US 7,704,683 B2

(12) United States Patent
Wittenberg et al.

(10) Patent No.: US 7,704,683 B2
(45) Date of Patent: Apr. 27, 2010

(54) PROCESS FOR PRODUCING PATTERNED OPTICAL FILTER LAYERS ON SUBSTRATES

(75) Inventors: Dieter Wittenberg, Osterode (DE); Thomas Kuepper, Bad Gandersheim (DE); Lutz Zogg, Bad Gandersheim (DE); Andree Mehrtens, Gruenenplan (DE)

(73) Assignee: Schott AG, Mainz (DE)

( * ) Notice: Subject to any disclaimer, the term of this patent is extended or adjusted under 35 U.S.C. 154(b) by 1056 days.

(21) Appl. No.: 11/182,444

(22) Filed: Jul. 15, 2005

(65) Prior Publication Data
US 2006/0014087 A1 Jan. 19, 2006

(30) Foreign Application Priority Data
Jul. 15, 2004 (DE) ........................ 10 2004 034 418

(51) Int. Cl.
*G03F 7/00* (2006.01)
*G02B 5/20* (2006.01)

(52) U.S. Cl. ...................... 430/321; 430/320; 430/311; 430/313; 430/315; 430/7

(58) Field of Classification Search ................. 430/320, 430/311, 313, 315, 321, 7
See application file for complete search history.

(56) References Cited

U.S. PATENT DOCUMENTS

| 4,119,483 | A | 10/1978 | Hubsch et al. |
| 5,120,622 | A * | 6/1992 | Hanrahan ........................ 430/7 |
| 5,260,094 | A * | 11/1993 | Giannelis et al. ............... 427/79 |
| 5,711,889 | A | 1/1998 | Buchsbaum |
| 5,868,482 | A | 2/1999 | Edlinger et al. |
| 6,067,138 | A | 5/2000 | Nishiguchi et al. |
| 6,468,703 | B1 * | 10/2002 | Edlingger et al. ............... 430/7 |
| 6,756,186 | B2 * | 6/2004 | Collins, III et al. ......... 430/321 |
| 7,282,240 | B1 * | 10/2007 | Jackman et al. ............. 427/282 |
| 2002/0094484 | A1 * | 7/2002 | Buchsbaum et al. ........... 430/7 |
| 2004/0084397 | A1 * | 5/2004 | Kamei et al. ................... 216/5 |
| 2004/0126676 | A1 | 7/2004 | Wang et al. |
| 2004/0145823 | A1 | 7/2004 | Jiang et al. |

(Continued)

FOREIGN PATENT DOCUMENTS

CH 1544607 4/1979

(Continued)

OTHER PUBLICATIONS

English Translation of Eiichi JP 2002-075638 (Mar. 2002).*

(Continued)

*Primary Examiner*—Kathleen Duda
*Assistant Examiner*—Caleen O Sullivan
(74) *Attorney, Agent, or Firm*—Ohlandt, Greeley, Ruggiero & Perle, L.L.P

(57) ABSTRACT

The invention provides a process for producing at least one optical filter layer segment on a substrate. The process includes
applying a masking comprising a resist layer on a surface of the substrate,
depositing an optical filter layer on the surface and the resist layer by vacuum deposition, and
removing the resist layer with a portion of the optical filter layer thereon from the surface.

The deposition of the optical filter layer, at least at times, takes place at a temperature of over 150° C., preferably in a range from over 150° C. up to and including 400° C.

28 Claims, 6 Drawing Sheets

U.S. PATENT DOCUMENTS

| | | | |
|---|---|---|---|
| 2004/0234678 A1* | 11/2004 | Hirai et al. | 427/58 |
| 2005/0179995 A1* | 8/2005 | Nikolov et al. | 359/359 |

FOREIGN PATENT DOCUMENTS

| | | | |
|---|---|---|---|
| DE | 19708949 | | 11/1997 |
| EP | 0037529 | | 10/1981 |
| JP | 55134931 (A) | | 10/1980 |
| JP | 59174804 | | 10/1984 |
| JP | 8220325 | | 8/1996 |
| JP | 11133226 | | 5/1999 |
| JP | 2003057424 | | 8/2001 |
| JP | 2001312067 | | 11/2001 |
| JP | 2002-075638 | * | 3/2002 |
| JP | 2004167326 | | 6/2004 |
| WO | WO99/42861 | | 8/1999 |
| WO | WO99/42864 | | 8/1999 |
| WO | WO99/54786 | | 10/1999 |
| WO | WO02/095489 | | 11/2002 |

OTHER PUBLICATIONS

Office Action for the corresponding Japanese Patent Application No. 2005-207119 dated Oct. 1, 2008.
Office Action dated Jul. 30, 2009 corresponding to Japanese Patent Application No. 2005-207119.
Chinese Office Action dated Jan. 8, 2010 for corresponding patent application No. 2005100846158 (w/ English translation).

* cited by examiner

PROCESS FOR PRODUCING PATTERNED OPTICAL FILTER LAYERS ON SUBSTRATES

CROSS-REFERENCES TO RELATED APPLICATIONS

The present application is claiming priority of German Patent Application No. 10 2004 034418.3-51, filed on Jul. 15, 2004, the content of which is herein incorporated by reference.

BACKGROUND OF THE INVENTION

1. Field of the Invention

The invention relates in general terms to the production of patterned optical coatings on substrates; in particular, the invention relates to the production of areally patterned, in particular segmented optical filter layers on substrates.

2. Description of Related Art

Areally segmented optical coatings on substrates are required, inter alia, for optical filters, such as for example optical rotary filters or color wheels for video projectors. A filter of this type sequentially filters light rays of different colors out of a light beam and projects them onto a screen by means of a digital micromirror device (DMD).

For the sequential filtering, a color wheel of this type is divided into various segments which filter out the different colors depending on the position of the rotating color wheel. To generate a flicker-free image at least of video quality, the light has to be broken down into different light rays of different color very quickly. This requires rapid rotation of the filter and, associated with this, inter alia accurate alignment and balancing of the filter disk, so that the latter is able to withstand the mechanical loads which occur during rotation. A further requirement for color wheels of this type is that the transition between the individual segments be as seamless as possible.

In a conventional process for producing a filter of this type, various filter disks which have in each case been uniformly coated and have defined filter properties, are cut into segments and the segments are then assembled again to produce a filter disk. Color wheels of this type and processes for producing them are known, for example, from DE 19708949 A1 and U.S. Pat. No. 5,868,482 A. However, the cutting and assembly operations are complex, and in particular assembly requires particular care, since firstly it is necessary for the transition to be as seamless as possible, and secondly accurate balancing of the assembled filter disk is required. Furthermore, the join between the individual segments also has to withstand the mechanical loads which occur during rotation.

Another possible way of producing a color wheel is to provide a substrate with segmented filter layers. For this purpose, it is known from WO 99/42861 A1, to provide the substrate with a color filter layer system by means of the lift-off technique. The filter layer is produced by sputtering or plasma-enhanced vapor deposition. By then dissolving the photoresist masking and lifting off the filter layer thereon, a segment of the filter layer is left in place on the substrate. This process is repeated for each filter segment. However, the process is restricted to use at low substrate temperatures below 150° C.

BRIEF SUMMARY OF THE INVENTION

The invention is based on the object of providing coating processes which are improved with regard to the drawbacks of the processes known from the prior art.

This object is achieved in a surprisingly simple way by the subject matter of the present invention. Advantageous configurations and refinements of the present invention are also provided.

Accordingly, the invention provides a process for producing at least one optical filter layer segment on a substrate, in which a masking comprising a resist layer is produced on a surface of the substrate, an optical filter layer is deposited on the surface by vacuum deposition, and the resist layer with the optical filter layer thereon is removed by causing the resist layer to swell.

It has been found that the standard removal of the resist layer by dissolving it may cause problems after high thermal loads during the vacuum deposition of the layer. According to the invention, however, by contrast the resist layer is removed from the substrate by being caused to swell. However, this form of removal is surprisingly less sensitive to temperature-induced changes in the resist layer. Accordingly, by way of example, it is also possible to tolerate higher temperatures during the coating operation, which in turn opens up the possibility, inter alia, of increasing the deposition rate at a higher temperature on the surface to be coated and thereby accelerating the production process. The deposition at a high temperature also allows a higher quality and durability of the color filter layers to be achieved. In particular, defects in the layers are reduced. For example, denser layers can be produced during vacuum deposition at higher temperatures. Layers of this type are therefore more stable and resistant with respect to chemical influences. For example, in many cases, the ability of these layers to take up water is lower or even absent altogether. The cause of the higher density is the higher mobility of the particles which impinge on the surface to be coated during the coating operation.

A refinement of this embodiment of the invention provides for the production of the masking comprising a resist layer to comprise the application of a photoresist, and the exposure and developing of the photoresist. Therefore, the process according to the invention can, for example, be combined without problems with the procedures which are standard in photolithography and the accurate patterning which can thereby be achieved.

According to another refinement of the invention, the production of the masking comprising a resist layer comprises the application of a stop resist. A stop resist, as used, for example, as a soldering stop resist in circuit board manufacture, has proven suitable for vacuum applications. Resists of this type typically also have a good thermal stability and can therefore also be removed by being (partially) dissolved after the coating operation.

For the resist layer to be removed by being caused to swell, it has proven suitable in particular to treat the resist layer with an alkaline solution.

A further possible way of improving the removal of the masking of the surface of the substrate to be coated is the application of a resist masking which can be pulled off. Accordingly, the invention also provides a process for producing an optical filter layer segment on a substrate, in which a masking comprising a resist layer is produced on a surface of the substrate, an optical filter layer is deposited on the surface using a vacuum deposition process, and the resist layer together with the optical filter layer thereon is pulled off the substrate.

This process has likewise proven relatively insensitive to temperature-induced changes in the resist masking, so that, for example, higher temperatures can be used during the coating operation.

Various possible ways of applying the resist are suitable for providing that surface of the substrate which is to be coated with a resist masking. According to a preferred embodiment of the invention, resist for the resist layer is printed on. The printing advantageously allows contouring as early as during application of the resist.

In this context, according to a refinement, it is particularly advantageous for the resist for the resist layer to be printed on by means of a print head in the manner of an ink-jet print head. Print heads of this type can already be used to produce very precise and accurate contours of the resist masking directly and even without further steps, such as for example subsequent photolithographic patterning on the substrate. A print head of this type may, for example, be a piezo-jet print head or a bubble-jet print head.

The printing operation may also be computer-aided. This can also readily be realized in particular in combination with a print head of this type in the style of an ink-jet print head. Accordingly, this refinement of the invention allows a defined, desired segmentation of an optical filter layer to be transferred directly from the computer to the substrate which is to be coated.

According to another refinement of the invention, resist for the resist layer can also be applied through or over a template resting on the surface. For this purpose, a template is arranged on the surface and resist is applied to the surface provided with the template. Application through a template allows the substrates, for example, to be provided very quickly with a resist masking which has already been areally patterned. Since masks of this type can be produced with a high level of accuracy, it is at the same time also possible to achieve a good level of accuracy for the contours of the corresponding optical filter segment.

Further processes which are suitable for applying the resist layer and can also be combined with the application processes described above are the application of resist by means of brushing, rolling, screen printing or spraying, in particular airless spraying.

According to yet another refinement of the invention, the surface which has been coated with resist is heated during the vacuum deposition of the optical filter layer, after which the optical filter layer which has been deposited on the resist layer acquires cracks as it cools. The otherwise undesirable formation of cracks has in this case proven expedient in order, for example, to accelerate the penetration of an agent for swelling the resist. This considerably accelerates the removal of the resist layer together with the optical filter layer thereof.

In order, inter alia, to achieve an even better thermal stability of the masking, the invention also provides for the direct masking with a separate contour mask. Accordingly, according to yet another embodiment of the invention, in a process for producing an optical filter layer segment on a substrate, a masking of the surface is produced by fixing a contour mask on the surface of the substrate, an optical filter layer is deposited on the surface by vacuum deposition, and the contour mask with the optical filter layer thereon is separated from the surface.

According to a refinement of this embodiment, the contour mask can also be arranged on the surface in the vacuum deposition chamber. This is advantageous, for example, if a plurality of different filter segments are to be applied to the substrate. The substrate then does not need to be removed from the chamber in order to produce a further masking for a different filter segment. In particular, the contour mask can even be put in place in vacuo, so that there is no need either for introduction and removal of the substrate via lock means or for venting of the chamber.

The contour mask can advantageously be held on the surface 3 by means of magnetic forces. This in particular also allows simple removal of the contour mask after vacuum deposition of the optical filter layer has taken place. By way of example, the contour mask can be fixed by means of a magnet arrangement arranged beneath that surface of the substrate which is to be coated. In this context, the arrangement "beneath this surface" does not mean that there is any defined orientation with respect to the direction of the force of gravity, but rather indicates a piece of information which relates to the surface to be coated. In other words, the contour mask is fixed in place either by means of a magnet arrangement which is located in the substrate itself and/or by means of a magnet arrangement arranged above or on the opposite side of the substrate from the surface which is to be coated. The magnet arrangement may, for example, comprise a pole shoe arrangement, a fine pole arrangement, a magnetic tape or individual magnets on a return plate.

To exert magnetic forces on the substrate, the contour mask may advantageously comprise a magnetizable material. Inter alia magnetizable thin metal sheet is suitable for this purpose.

In general, the contour mask can be produced from materials which are sufficiently vacuum-compatible. It is preferable to use materials which are also sufficiently thermally stable. For example, according to a refinement of the invention it is preferable for a metal foil or plastic film, in particular comprising a thermally stable plastic, to be used for the contour mask. On account of its thermal stability, polyimide is an example of a particularly suitable plastic. Furthermore, a contour mask with accurate contours can advantageously be produced from a film/foil by milling or laser cutting or water jet cutting or etching or a combination of at least two of these processes.

An alternative or additional method of arranging the contour mask in accordance with another embodiment of the invention is for the contour mask to be fixed on the surface by means of a bonding layer. This embodiment of the invention likewise allows easy separation of the contour mask after the vacuum coating of the surface. For this purpose, it is preferable for the contour mask to be pulled off the surface following the deposition operation.

The bonding layer may even be designed in such a way that it is subject to changes on account of the action of heat during the coating operation, causing the bonding properties to deteriorate, so that although the contour mask is still bonded in place after the coating operation, it is particularly easy to remove again. As an alternative or in addition, however, it is also possible to (partially) dissolve the bonding layer by means of a suitable solvent or to cause the bonding layer to swell by means of a swelling agent, for example an alkaline solution.

Various additional measures are advantageous for fixing the contour mask as accurately as possible in the intended position. By way of example, the position of the contour mask can be fixed or adjusted by means of one or more aligning holes or by means of at least one stop edge or at least one mark or clamp or by means of machine orientation or by means of at least one projection, for example a guide mandrel, on the surface or mask or a substrate holder, which engages in a recess, or by means of a combination of at least two of these measures.

The contour mask may have a different coefficient of thermal expansion than the substrate material. This can lead to the contour mask moving with respect to the surface of the substrate which is to be coated when the substrate is heated during the vacuum coating operation. To reduce possible inaccuracies in the contours of the optical filter layer segment which may result from this phenomenon, according to a refinement of the embodiment of the invention using a contour mask, it is provided that the position of the contour mask is fixed with respect to the surface at the fixing point, the position of which is selected in such a way that a local shift in the contours of the mask resulting from a temperature change during the vacuum deposition of the optical layer is minimized.

All possible vacuum deposition processes can be used to coat the surface of the substrate. By way of example, according to one embodiment of the invention, it is provided that the vacuum deposition of the optical filter layer comprises the physical vapor deposition (PVD) of at least one layer. In this context, the at least one layer can be deposited by sputtering or evaporation coating, including by plasma-enhanced evaporation coating. Sputtering allows high-quality layers to be produced even from materials which are difficult to evaporate. Evaporation coating, on the other hand, is expedient inter alia with a view to achieving high deposition rates and therefore to accelerating the production process.

According to another embodiment of the invention, the vacuum deposition of the optical filter layer comprises the chemical vapor deposition of at least one layer. In this context, consideration is also given to the vacuum deposition of at least one layer by means of plasma impulse induced vapor deposition.

Moreover, a preferred refinement of the invention provides for the vacuum deposition of the optical filter layer to comprise the deposition of a multiple layer. In this case, the individual layers are preferably deposited sequentially by means of a suitable coating source. In particular, it is possible to deposit at least two individual layers of different compositions, with the refractive index preferably also differing.

Multiple layers of this type allow a wide range of advantageous optical filter properties to be achieved. By way of example, interference layer systems can be produced using suitably adapted layer thicknesses and refractive indices of the layers. An interference filter layer deposited by means of the process according to the invention can be used, inter alia, as an antireflection coating or particularly preferably also as a color filter. Moreover, an interference filter layer may in particular also have a plurality of individual layers with an alternating refractive index for generating partial reflections.

Yet another embodiment of the invention provides a process for producing at least one optical filter layer segment on a substrate, in which a masking comprising a resist layer is produced on a surface of the substrate, an optical filter layer is deposited on the surface by vacuum deposition, and the resist layer with the optical filter layer thereon is removed, wherein the deposition of the optical filter layer takes place at a temperature of over 150° C., preferably in a range from over 150° C. up to and including 400° C. The lift-off step, or the removal of the resist layer with the filter layer thereon, can be effected, for example, by causing the resist to swell or by (partially) dissolving the resist using a suitable solvent.

A refinement of this embodiment of the invention provides for the vacuum deposition of the optical filter layer at least at times to take place in the range 170° C.±15° C., preferably in the range 170° C.±10° C.

The vacuum deposition may in particular comprise plasma-enhanced deposition, in particular sputtering or plasma-enhanced evaporation coating.

In the case of vacuum deposition of the optical filter layer, in all embodiments of the invention, the masked surface may be at a temperature of over 150° C., preferably in a range from over 150° C. up to and including 400° C. In this context, it has proven expedient for the stability of the deposition process if the temperature of the masked surface at least at times is in the range 170° C.±15° C., preferably in the range 170° C.±10° C. In conventional processes with photoresist masking, these temperature ranges are actually avoided in general, so that it then remains possible to dissolve the resist.

According to yet another embodiment of the invention, it is provided that a segment of the surface in the shape of a segment of a circle be coated with an optical filter layer. This type of shape of a filter segment is advantageous in particular in the case of rotating optical filters, for example in the case of a disk-like substrate for a color wheel, as used, for example, in a digital projector.

One further possibility is, inter alia, the deposition of an optical filter layer segment which is shaped in the form of a visible item of information, in particular lettering, a symbol or a logo. Consequently, the invention also allows decorative or marking effects to be achieved.

According to a preferred embodiment of the invention, the process steps involved in the production of an optical filter segment on a substrate can also be repeated a number of times, in order for a plurality of filter segments to be applied to the substrate. Accordingly, the invention also provides an embodiment of the process in which the steps of masking and vacuum deposition are repeated at least once, with different segments of the surface being provided with an optical filter layer by different masking. To provide different optical properties of the individual filter segments, the different segments may in particular be provided with different optical filter layers.

The process according to the invention is suitable for coating a very wide range of substrates, provided that these substrates can be coated in vacuo. A material which is particularly suitable for coating is glass, on account of its transparency, vacuum compatibility and thermal stability. Accordingly, it is provided in a further embodiment of the invention that a glass substrate or a glass surface of a substrate be coated. However, it is also possible for other materials, for example materials with metallic or ceramic surfaces, or also plastics that are suitable for vacuum deposition, to be coated.

There is a wide range of uses for the process according to the invention. In addition to the production of a segmented optical filter, for example a color filter designed as a color wheel, it is also possible, for example, for sensors to be equipped with optical filter layer segments of this type. By way of example, the sensor may have a plurality of sensor surfaces, at least one of which is covered by an optical filter layer segment. A sensor of this type may, for example be an image sensor in which the optical filter layer segments are used for color filtering.

Further uses include the coating of films/foils and/or the coating of substrates with decorative patterns.

In the text which follows, the invention is explained in more detail on the basis of exemplary embodiments and with reference to the drawings, in which identical and similar elements are denoted by the same reference designations and the features of various exemplary embodiments can be combined with one another.

DETAILED DESCRIPTION OF THE INVENTION

Process steps involved in the production of a substrate 1 which has been coated in accordance with a first embodiment of the invention are shown with reference to FIGS. 1A to 1D, which diagrammatically depict cross-sectional views of a substrate 1.

The process for producing a substrate 1 with one or more optical filter layer segments is based on the fact that
- a masking comprising a resist layer is produced on a surface 3 of the substrate 1,
- an optical filter layer is deposited on the surface by vacuum deposition, and
- the resist layer with the optical filter layer thereon is removed by causing the resist layer to swell.

Figure 1A:
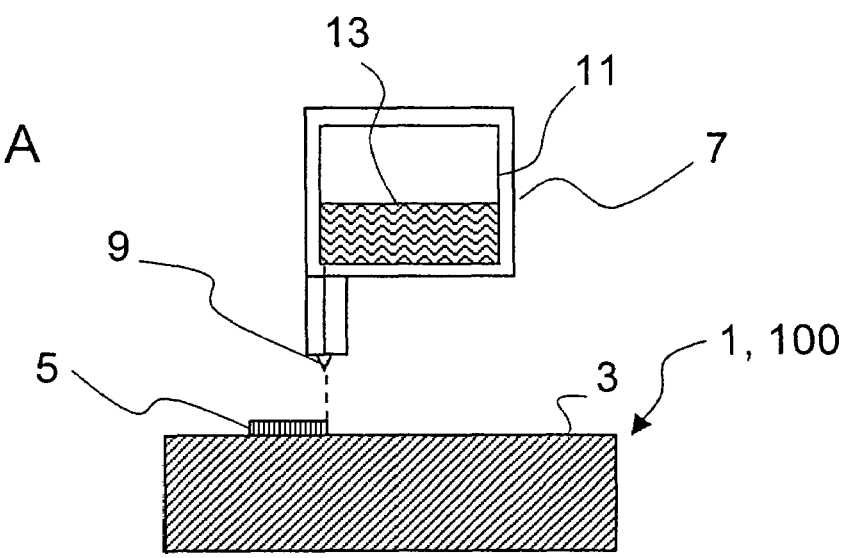
FIG. 1A to 1D show process steps involved in the production of a substrate which has been coated in accordance with a first embodiment of the invention.

According to this first embodiment of the invention, which is shown in FIG. 1A to 1D, the substrate 1 is masked with a resist layer 5 by the application of a resist 13, the application of the resist 13 in particular being computer-controlled via the nozzles 9 of a print head 7 which is connected to a computer (not shown in FIG. 1A). A print head of this type can be used to produce an areally patterned or segmented resist layer 5 with particularly sharp, well defined edges.

Any desired material which can be coated by means of a vacuum deposition process can be used for the substrate. In this context, consideration may be given, for example, to glass, glass-ceramic, ceramic, plastic and/or metal. In the exemplary embodiment shown in FIG. 1A to 1D, the substrate 1 used is a disk-like glass substrate 100 for a color wheel.

The resist 13 may, for example, be a stop resist, such as in particular a soldering stop resist which is known from circuit board manufacture, a lift-off resist or a photoresist.

Various further measures can also be taken to improve the application of resist. For example, the resist 13 can be cooled in the tank 11 and/or the feed line leading to the nozzles 9 and/or in the nozzle, in particular by cooling the nozzle and/or the feed line, in order to reduce the evaporation of the solvent of the resist prior to application and therefore to prevent the print head 7 from becoming blocked. Moreover, the printing can be carried out in a suitable environment, such as for example a compressed and/or solvent-containing atmosphere.

The substrate may also be preheated, for example during printing, in order for the solvent contained in the resist of the resist layer 5 to be removed as quickly as possible after the printing operation, in order thereby to solidify the resist layer.

Figure 1B:
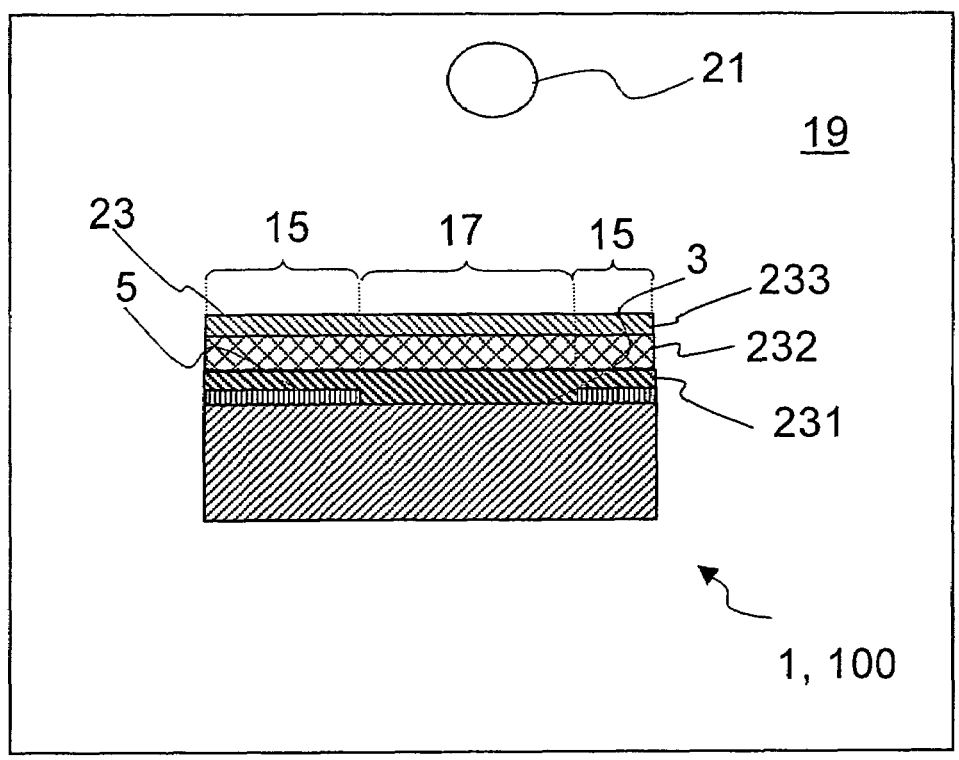

FIG. 1B shows a further phase of the production process. The step of masking the substrate 1 with the resist layer 5 has ended. At least one subregion or segment 15 of the surface 3 of the substrate 1 has been masked by the resist of the resist layer 5 by the patterned application of the resist layer 5, whereas at least one other segment 17 has remained open or uncovered.

The substrate 1 provided with the resist layer 5 which has been patterned in this way is arranged in a vacuum chamber 19 opposite or in a symbolically indicated coating source 21. Then, vacuum deposition of an optical filter layer 23 on that surface 3 of the substrate 1 which has been provided with the patterned resist layer 5 is carried out in the evacuated coating chamber 19 by means of the coating source 21. In this exemplary embodiment, the optical filter layer 23 furthermore comprises a plurality of individual layers 231, 232, 233, which are applied successively by vacuum deposition; in this exemplary embodiment, at least two of the individual layers 231, 232, 233 are also deposited with different compositions.

The vacuum deposition of the optical filter layer may, for example, comprise the physical vapor deposition (PVD) of at least one layer. According to a refinement, the coating source 21 may for this purpose comprise an evaporation device, in which case the vacuum deposition of the optical filter layer 23 comprises the application of at least one of the layers 231, 232, 233 by evaporation coating.

According to another refinement, the vacuum deposition of the optical filter layer 23 comprises sputtering on at least one of the layers 231, 232, 233, in which case the coating source 21 has at least one sputtering source for this purpose.

It is also possible for at least one of the individual layers 231, 232, 233 to be deposited on the surface 3 by chemical vapor deposition by means of a correspondingly designed coating source 21. A preferred refinement of this embodiment in particular provides for the layer to be deposited by means of plasma impulse induced chemical vapor deposition (PICVD). For this purpose, the coating source 21 may, for example, have a gas inlet for suitable precursor gases or gaseous starting materials and a device for generating pulsed electromagnetic waves, by means of which a pulsed plasma is generated in the precursor gas atmosphere. Reaction products which accumulate on the surface 3 and may react with one another are then formed in the plasma, so that a layer is deposited on the surface 3. To produce a multiple optical filter layer 23 comprising individual layers 231, 232, 233, the process gas composition can be altered during the PICVD coating operation. By way of example, it is possible to produce a filter layer comprising alternating individual layers of $SiO_2$ and $TiO_2$ by alternately admitting titanium-containing and silicon-containing precursor gases or starting materials.

At least at times, the vacuum deposition can take place with the masked surface at a temperature of over 150° C., in particular in a range from over 150° C. up to and including 400° C. According to a preferred procedure, the temperature of the masked surface at least at times is in the range 170° C.±15° C., preferably in the range 170° C.±10° C. It has been found that higher substrate temperatures may be advantageous in a number of respects during vacuum deposition. For example, in the case of PVD coating it is possible to produce denser layers at higher temperatures. Layers of this type are therefore also more stable and resistant with respect to chemical influences. In particular, denser layers of this type can only take up a small amount of water, or even cannot take up any water at all. The reason for this is the higher mobility of the particles impinging on the surface which is to be coated.

Figure 1C:
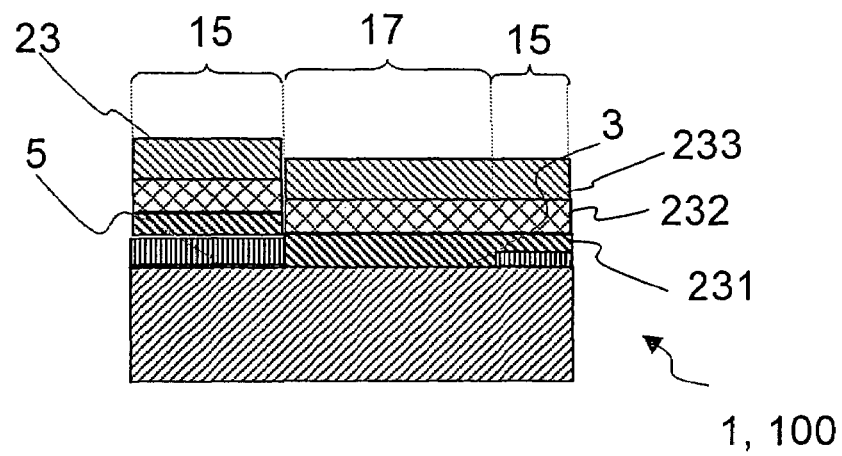

The removal of the resist layer with the optical filter layer 23 thereon is illustrated in FIG. 1C.

That part of the resist layer 5 which is shown on the right-hand side of FIG. 1C is still in the state prior to swelling, whereas that part of the resist layer 5 shown on the left-hand side of FIG. 1C is illustrated in the swollen state. The swelling of the resist layer 5 can be achieved in a simple way by means of an alkaline solution, for example potassium hydroxide or sodium hydroxide solution. On account of the different expansion coefficients of resist layer and optical filter layer, it is also possible for cracks to form in the optical filter layer during cooling of the substrate after the coating operation, through which cracks a swelling agent, such as for example an alkaline solution, can penetrate. This additionally accelerates the swelling operation. The swelling of the resist layer 5 causes it to become detached from the coated surface 3 together with the regions of the optical filter layer 23 which are present on the resist layer 5. At the same time, the join in the filter layer 23 between the regions 15 and 17 also breaks, if a join of this type has actually formed during the deposition of the layer 23, so that by detaching the resist layer 5 this layer can then be removed together with the optical filter layer thereon. For this exemplary embodiment, inter alia stop resist is a material which is eminently suitable for the masking, since it is able to swell and, moreover, has a good thermal stability and low gas release rate in vacuo. It is also possible to use a photoresist, which should be considered in particular if further contours in addition to the masking produced by printing are to be produced, by photolithographic patterning.

Figure 1D:
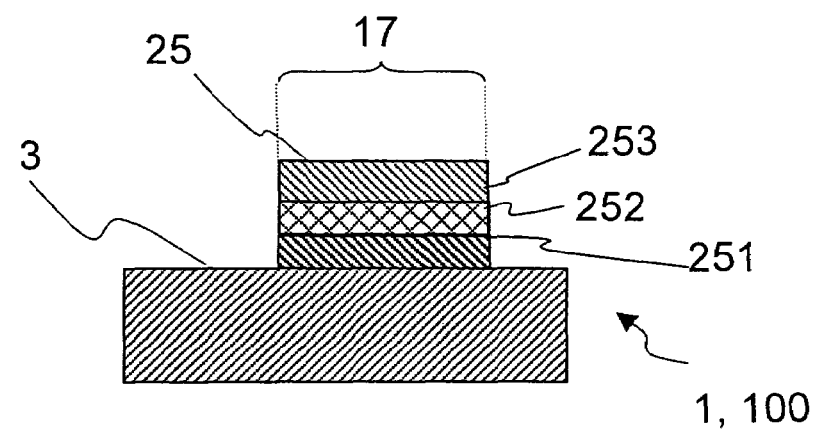

An exemplary embodiment of a coated substrate according to the invention as a result of this embodiment of the process is illustrated in FIG. 1D. The coated substrate 1 shown accordingly has a surface 3 which has been provided with an optical filter layer segment 25 comprising individual layers 251, 252, 253. The filter layer segment 25 covers the subregion or the segment 17 of the surface 3 which was not covered by the resist layer 5.

According to another embodiment of the invention, the optical filter layer segment 25 is produced on the substrate 1 by, for example as shown in FIG. 1A, producing a masking comprising a resist layer 5 on the surface 3 of the substrate 1, for example as illustrated in FIG. 1B, an optical filter layer 23 is deposited on the surface 3 by vacuum deposition, and the resist layer 5 with the optical filter layer thereon is removed, generally by a lift-off technique, wherein the deposition of the optical filter layer 23 takes place in the vacuum chamber 19 at a temperature of over 150° C., preferably in a range from over 150° C. up to and including 400° C. According to this embodiment, the lift-off step, i.e. the lifting off of the resist layer with the filter layer thereon, can likewise be effected by swelling, as illustrated in FIG. 1C, or by (partially) dissolving the resist of the resist layer 5 using a suitable solvent. According to this embodiment of the invention, the production of a masking comprising a resist layer 5 may also comprise the photolithographic patterning of a photoresist layer. It is preferable for the vacuum deposition of the optical filter layer 23 at least at times to take place in the range 170° C.±15° C., particularly preferably in the range 170° C.±10° C.

Moreover, in this embodiment the vacuum deposition is preferably effected by plasma-enhanced deposition, in particular sputtering or plasma-enhanced evaporation coating.

Figure 2:
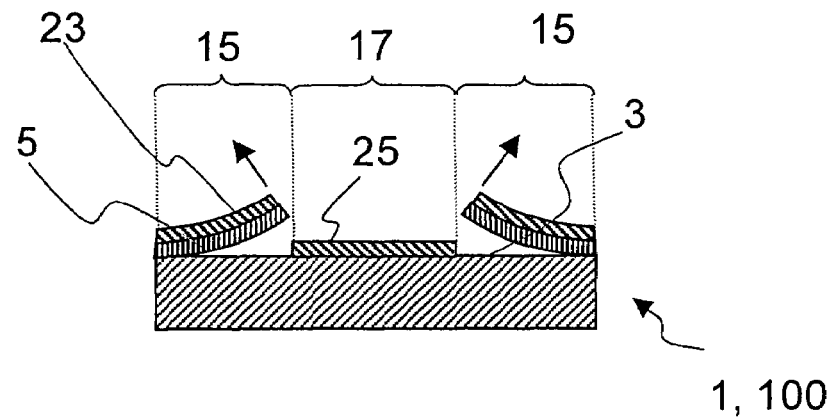
FIG. 2 shows a variant of the process steps illustrated in FIG. 1A to 1D, FIGS. 3A, 3B and 4A, 4B show process steps involved in masking the substrate in accordance with two variants of this embodiment.

FIG. 2 illustrates a variant of the process steps which have been explained with reference to FIG. 1C. This embodiment of the invention is likewise initially based, in accordance, for example, with the procedure explained with reference to FIGS. 1A and 1B, on producing a masking comprising a resist layer 5 on a surface 3 of the substrate 1, and depositing an optical filter layer 23 on the surface 3 by means of a vacuum deposition process.

In this case, however, rather than the resist layer 5 being removed by swelling as explained with reference to FIG. 1C, the resist layer 5 together with the optical filter layer 23 which has been deposited thereon is pulled off the substrate 1 or its coated surface 3, so that once again a substrate 1 comprising an optical filter layer segment 25 covering a subregion 17 of the surface 3 is obtained. It is particularly expedient in this context to use a resist which can be pulled off for the resist masking in order to enable the resist layer 5 to be pulled off. Moreover, the optical filter layer 23 is illustrated by way of example as a single filter layer. However, the process can of course also be employed with multiple filter layers, as shown for example in FIG. 1B or 1C.

Figure 3A:
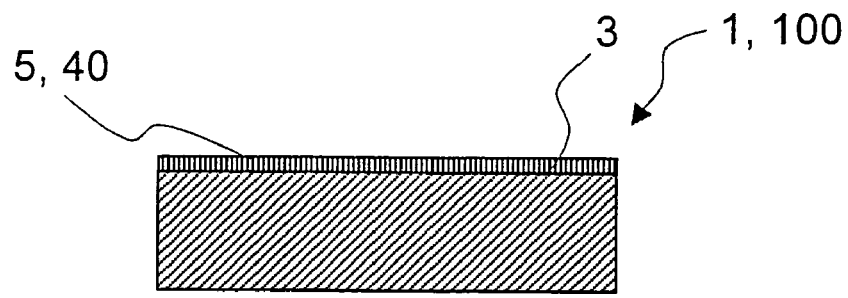
Figure 3B:
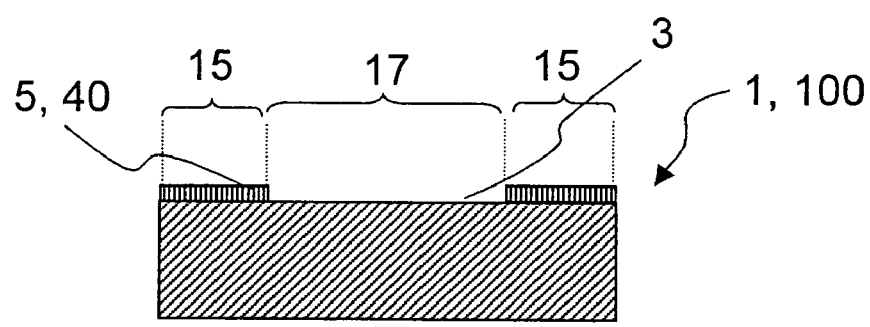

FIGS. 3A and 3B show yet another exemplary embodiment used to mask the surface 3. In this case too, by way of example, a disk-like glass substrate 100 for a color wheel is used as substrate 1 for the coating with an optical filter layer segment 25. In this example, the masking is effected by coating with photoresist 40 followed by exposure and developing of the photoresist. In the exemplary embodiment illustrated, the coating is effected in particular by areal application of the photoresist 40. This application can be effected, for example, by brushing, rolling, screen printing or airless spraying. Then, the photoresist 40 is exposed and developed in accordance with the desired pattern of the masking or the corresponding contour of the intended optical filter layer segment, so that a resist layer 5 which has been areally patterned or segmented as diagrammatically depicted in FIG. 3B is obtained as masking of the surface 3 of the substrate 1.

Then, the substrate which has been masked in this way can be treated further as explained with reference to FIG. 1B to 1D, in order to obtain a substrate according to the invention with one or more optical filter layer segments.

Figure 4A:
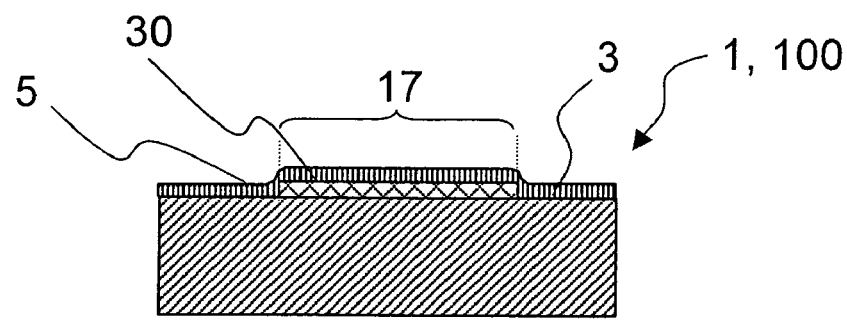
Figure 4B:
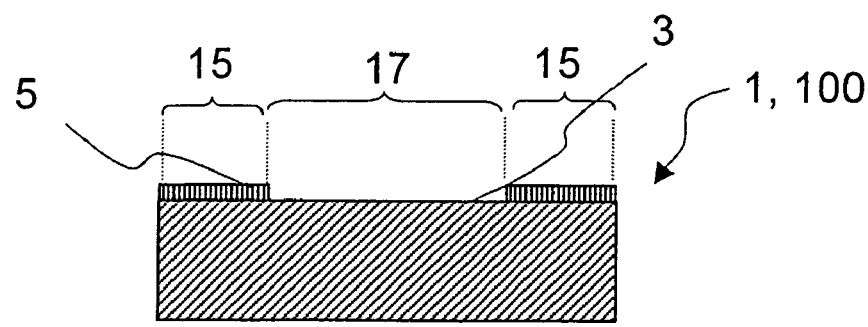

FIGS. 4A and 4B show yet another variant for the production of a patterned resist masking with a resist layer 5 which has been contoured or segmented or patterned areally in accordance with the optical filter layer segment which is to be applied. According to this variant, as illustrated in FIG. 4A, a template 30 is arranged on the surface 3. Then, resist is applied to the surface provided with the template, so as to produce a resist layer 5 which covers at least the subregions 15 of the surface which are intended for the masking. The resist can be applied, for example, by means of brushing, rolling, screen printing or airless spraying.

Next, the template 30 is removed, so that a resist layer 5 as shown in FIG. 4B, which has been segmented or patterned areally in accordance with the contour of the template 30, remains on the surface 3 as masking. The substrate 1 which has been masked in this way can then, like the substrate illustrated in FIG. 3B, be treated further in accordance with the process steps shown in FIG. 1B to 1C.

Figure 5A:
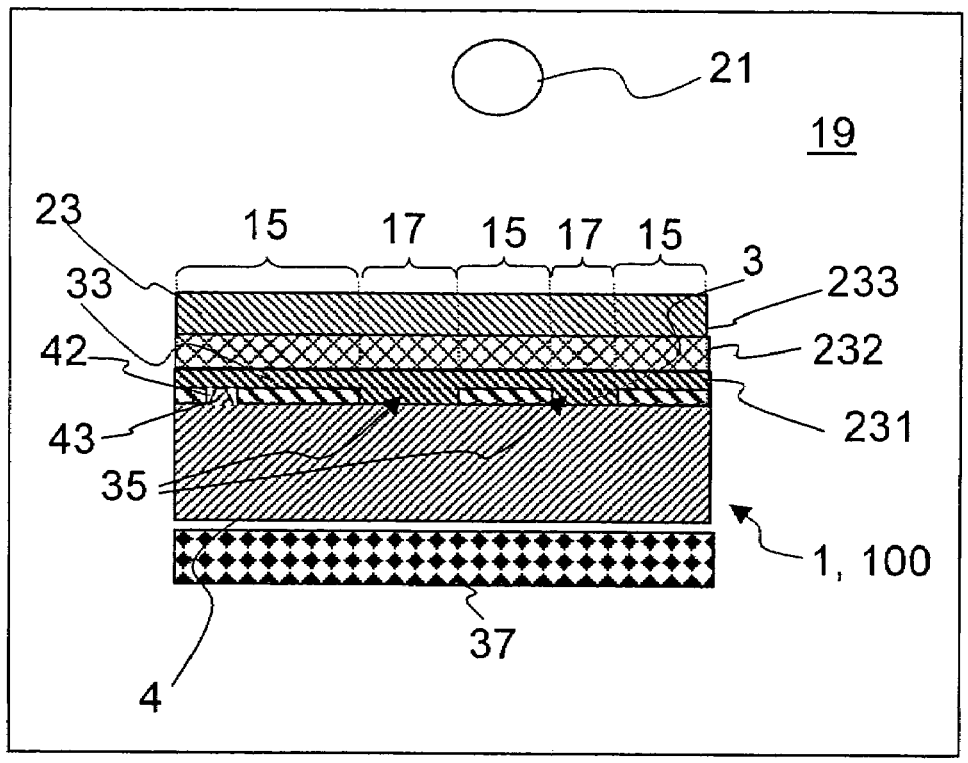
FIGS. 5A and 5B show an embodiment of the invention with magnetic fixing of a contour mask.
Figure 5B:
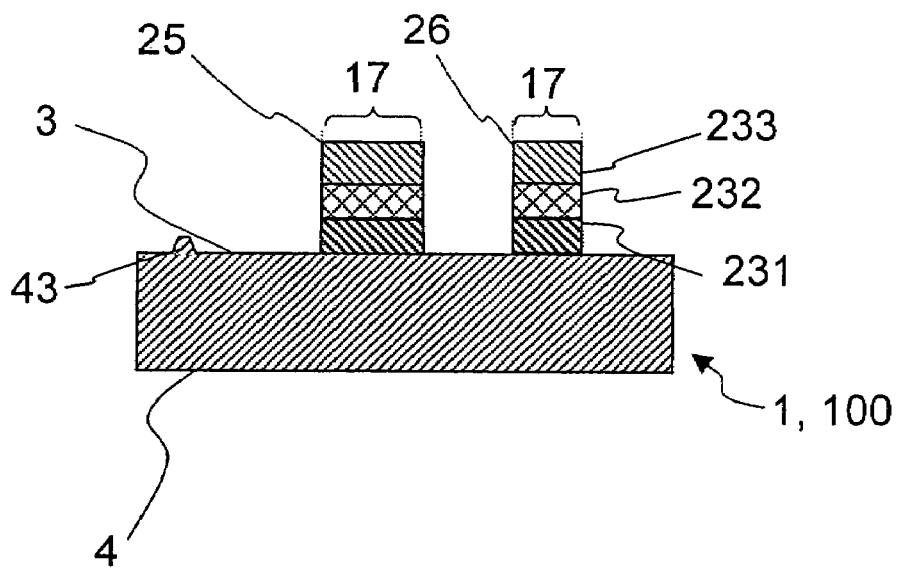

A further embodiment of the process according to the invention for producing an optical filter layer segment on a substrate is illustrated on the basis of the diagrammatic cross-sectional views of FIGS. 5A and 5B. In this embodiment of the invention, a masking of the surface is produced by fixing a contour mask on the surface of the substrate, an optical filter layer is deposited on the surface by vacuum deposition, and the contour mask with the optical filter layer thereon is then separated from the surface.

FIG. 5A illustrates a substrate 1 which is arranged in the vacuum chamber 19 and on which the contour mask 33 with segment-cutouts 35 has been fixed on that surface 3 of the substrate 1 which is to be coated. In the state shown in FIG. 5A, the multiple filter layer 23 comprising individual layers 231, 232, 233 has already been deposited.

In particular, in the exemplary embodiment shown in FIG. 5A, the contour mask 33 is held on the surface 3 by means of magnetic forces. A magnet arrangement 37 is arranged below the surface 3 on the opposite side 4 of the substrate in order to exert magnetic forces. The magnetic field generated by the magnet arrangement 37 then produces an attraction force between the contour mask 33 and the magnet arrangement 37, which pulls the contour mask onto the surface 3 of the substrate. To enable magnetic forces to be exerted on the contour mask 33, it is expedient if the contour mask comprises a magnetizable material. By way of example, a metal foil formed from magnetizable thin metal sheet is suitable for this purpose. A contour mask with sufficiently accurate contours can be produced, for example, from a film or foil by milling or laser cutting or water jet cutting or etching or a combination of at least two of these processes. Some of these processes, such as for example milling, also allow the processing of a stack of films/foils, in order to obtain a plurality of contour masks in one step.

For the contour mask to be oriented as accurately as possible with respect to the subregions 17 which are to be coated, it is possible to employ additional measures, such as in particular fixing or adjusting the position by means of
one or more aligning holes, or by means of
at least one stop edge or
at least one mark or clamp or by means of
machine orientation or by means of
at least one projection on the surface or mask or a substrate holder (not shown), which engages in a recess in the mask or surface, or by means of
a combination of at least two of these measures.

FIG. 5A shows an exemplary embodiment with a projection 43 in the form of a centering mandrel on the surface 3, which engages in a recess 42 in the mask 33. It is also advantageous in particular for a positioning means of this type, such as for example one or more centering mandrels, to be arranged on the substrate holder, so that these means, such as for example projections, do not have to be provided on the substrate 1.

According to a refinement of this embodiment, the position of the projection 43 and of the corresponding recess 42 can furthermore be selected in such a way that the position of the contour mask 33 is fixed with respect to the surface 3 at the fixing point formed by projection 43 and cutout 42, the position of this fixing point being selected in such a way that a local shift in the contours of the mask 33 resulting from a temperature change during the vacuum deposition of the optical filter layer 23 is minimized. This reduces any undesirable deviations in the contour of the optical filter layer segment to a minimum.

In this embodiment of the process, according to a refinement the contour mask 33 can also be arranged on the surface 3 only when it is in the vacuum deposition chamber 19. This allows an optical filter layer segment to be produced in the vacuum prevailing in the chamber without the substrate 1 having to be removed in order to be masked.

After the vacuum deposition of the optical filter layer 23, the contour mask 33, on account of the magnetic fixing, can then easily be removed together with the filter layer 23 thereon, resulting in a substrate 1 as shown in FIG. 5B, with optical filter layer segments 25, 26 corresponding to the segment cutouts 35 of the contour mask 33.

According to a variant of this embodiment of the invention, the contour mask 33 is fixed on the surface by means of a bonding layer. In this case, it is preferable for the bonding layer to be applied to the contour mask. Then, as illustrated in FIG. 5A, the substrate 1 together with the contour mask 33, which is securely bonded to the surface 3 by the bonding layer, is coated with an optical filter layer 23. Then, after the optical filter layer 23 has been deposited, the contour mask 33 can be pulled off the surface. The substrate can then be cleaned—preferably by washing—in order for any residues of adhesive which may be present to be removed from the surface 3.

By way of example, a plastic film made from thermally stable plastic is suitable for use as contour mask 33 for this variant. In particular a polyimide film which is particularly thermally stable can be used for this purpose.

FIGS. 6 to 9 illustrate various exemplary embodiments for a magnet arrangement 37 which can be used for the magnetic fixing of the contour mask.

Figure 6:
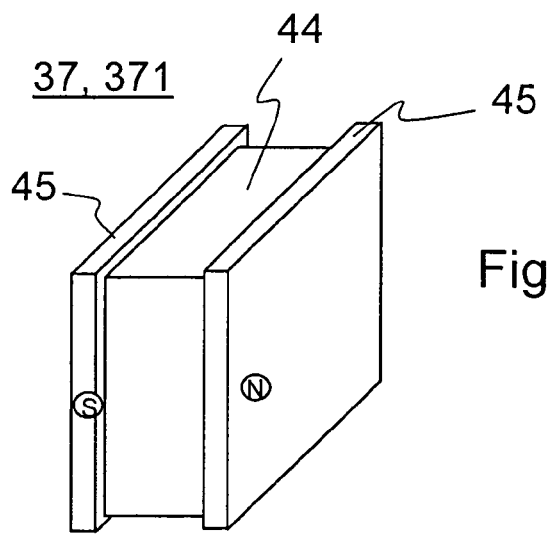
FIG. 6 to 9 show various exemplary embodiments of magnet arrangements.

FIG. 6 shows a magnet arrangement 37 which comprises a pole shoe arrangement 371 with a magnet body 44 and pole shoes 45. A magnet arrangement 37 of this type is suitable, for example, for relatively small contour masks. It is also possible, however, for example to use a plurality of pole shoe arrangements 371 of this type in order to hold the contour mask 33 in place at a number of regions.

Figure 7:
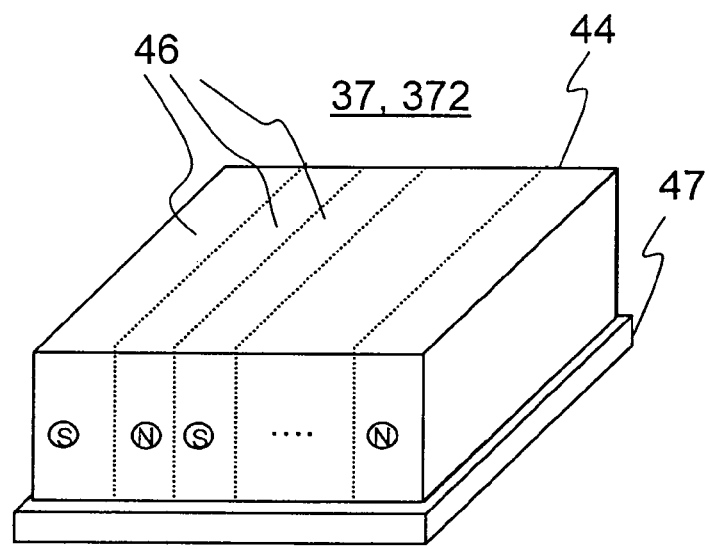

FIG. 7 shows an exemplary embodiment of a magnet arrangement 37 with a fine pole arrangement 372. The fine pole arrangement 372 comprises a magnet body 44 with poles 46 which is secured to a return plate 47. The fine pole arrangement 371 is preferably arranged on or above that side 4 of the substrate to be coated which is on the opposite side from the surface 3 to be coated, in such a way that the return plate 47 faces away from the substrate.

Figure 8:
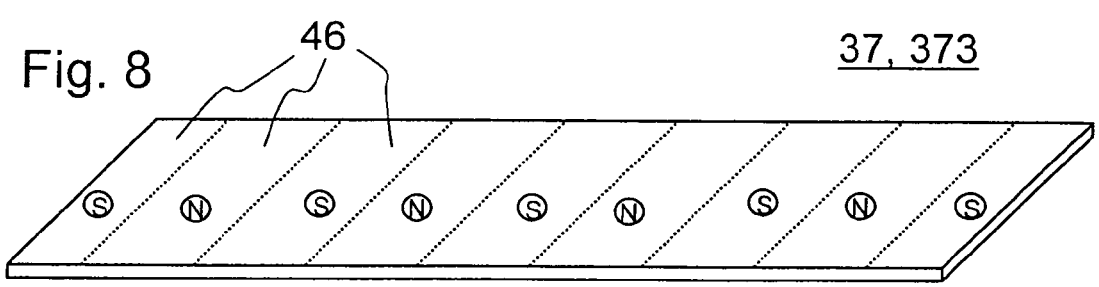

In the exemplary embodiment illustrated in FIG. 8, the magnet arrangement 37 comprises a magnetic tape 373 comprising poles 46. A magnetic tape of this type offers the advantage, for example, that it can be flexible and can therefore adapt to the shape of the substrate 1 as part of its deformability.

Figure 9:
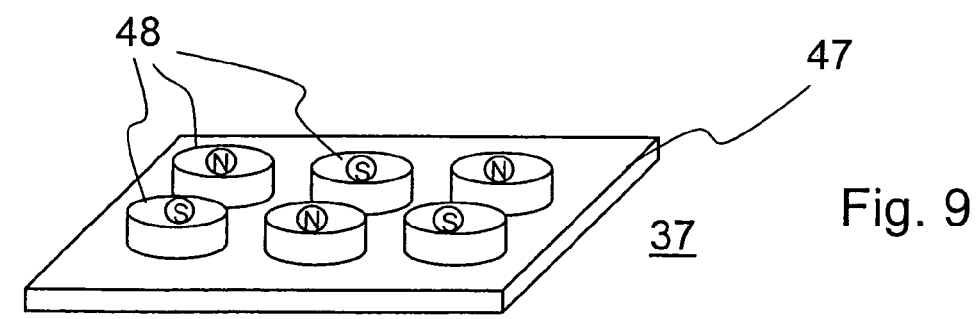

Yet another option for a magnet arrangement 37 is illustrated in FIG. 9. This magnet arrangement 37 comprises a plurality of individual magnets 48 which are arranged on a return plate 47 in order to achieve a sufficiently homogenous distribution of the magnetic forces acting on the contour mask 33. By way of example, in this arrangement it is also possible, as illustrated in FIG. 9, for north and south poles to alternately face outward. This arrangement is preferably also arranged in such a way at the substrate 1 that the return plate 47 faces away from the substrate or in such a way that the poles of the individual magnets face toward the side 4.

With these examples of magnet arrangements as shown in FIGS. 5 to 9, it is possible to achieve a substantially homogenous distribution of the attraction forces over the area of the mask, in order to ensure good contact with the contour mask over the area which is to be coated. This prevents the layer material of the optical filter layer from creeping under the contour mask and at the same time means that the sharpness of the contours of the optical filter layer segment is comparable to the sharpness of the contours of the mask.

Figure 10:
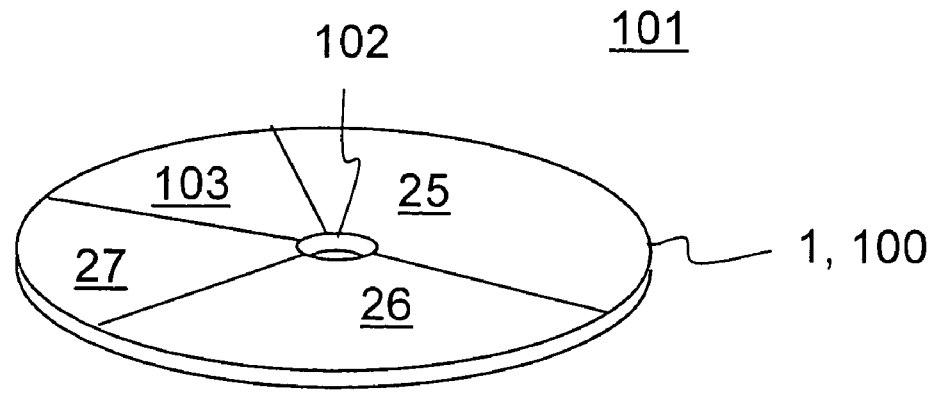
FIG. 10 to 12 show exemplary embodiments of substrates which have been coated in accordance with the invention.
Figure 11:
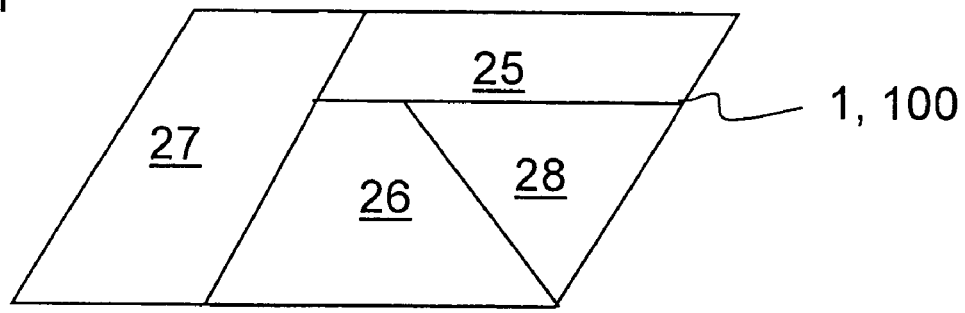
Figure 12:
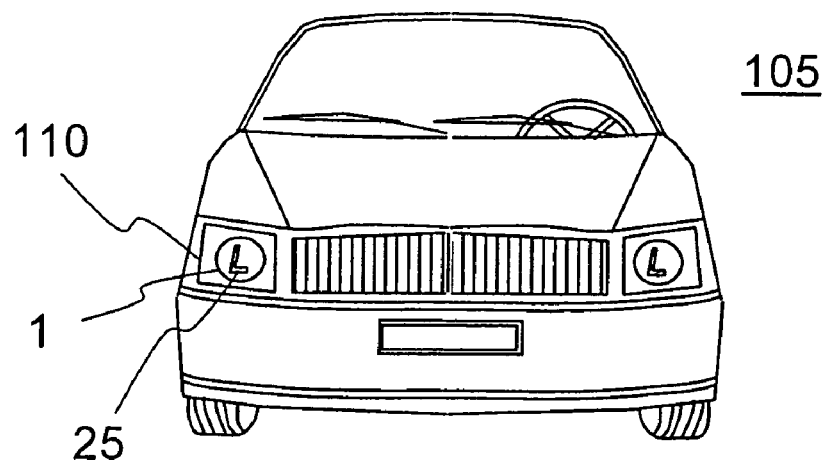

FIGS. 10 to 12 show exemplary embodiments of substrates which have been coated in accordance with the invention. FIG. 10 illustrates a filter disk 101 for a color wheel as used in digital projectors. The filter disk 101 comprises a disk-like glass substrate, as is also shown in cross-sectional view in FIG. 1A to 1D, FIG. 2, FIGS. 3A, 3B, 4A, 4B, 5A, 5B. The glass substrate 100 is circular and has a centrally disposed opening 102. This opening is used, for example, to secure and center the filter disk 101 on a base. The substrate 1 or 100 has been coated with three optical filter layer segments 25, 26, 27 in the form of segments of a circle which have been produced in accordance with the invention. The filter layer segments 25, 26, 27 have preferably been deposited as multiple interference filter layers, in order in each case to filter out certain colors from a light source in whose beam path the color wheel is arranged. The steps of masking and vacuum deposition are repeated for each segment 25, 26, 27 corresponding to the three different optical filter layer segments; the intended different segments of the surface of the substrate are each provided with different optical filter layers by using different masking.

The color wheel comprising the filter disk rotates, so that the colors are filtered out sequentially. A further circle segment 103 is uncoated, in order to provide an additional white or bright channel. The individual segments in particular also do not have to be of equal size. Rather, the size of the sectors covered by the filter layer segments, 25, 26, 27 may be dependent on the spectral distribution of the light source used, in order to achieve a balanced color distribution with a good light yield.

However, the process according to the invention is also suitable for coating a wide range of other substrates. By way of example, FIG. 11 shows a film or foil 104 which has been coated with a plurality of optical filter layer segments 25, 26, 27, 28. A film/foil of this type can also be used as a segmented optical filter. However, the filter layer segments can also be used, for example, for decoration purposes. A substrate of this type can also be used for a sensor having a plurality of sensor surfaces each assigned to one optical filter layer segment, in order to filter light which is incident on the sensor surfaces. This allows different colors to be filtered out and detected by each of the segments. It is also possible for a sensor itself to be used as substrate for coating of one or more of its sensor surfaces. One example of an application for the invention is coating of the pixel regions of an image sensor for color filtering.

Moreover, the invention can also be used to deposit optical filter layer segments which are shaped in the form of a visible item of information, in particular lettering, a symbol or a logo. An example of this is illustrated in FIG. 12. FIG. 12 shows a front view of a motor vehicle 105 with headlamps 110. Substrates 1 which have been coated in accordance with the invention are in each case incorporated in the headlamps 110 of the motor vehicle 105. The optical filter layer segments 25 on the preferably transparent substrates which have been incorporated are in particular patterned in the form of a visible item of information. In particular, in this exemplary embodiment the coating can be patterned in the shape of a logo; the logo formed by the coating 25 in FIG. 12 is symbolically represented, purely as an example, in the shape of an italic "L". By way of example, the coatings 25 can be patterned in the form of the logo or lettering of the manufacture of the motor vehicle by being areally patterned, in particular segmented. This logo is then visible when the headlamp is switched on or under gentle illumination, for example when the parking light is switched on, resulting in an attractive decorative effect.

It will be clear to the person skilled in the art that the invention is not restricted to the exemplary embodiments described above, but rather can be varied in numerous ways. In particular, the features of the individual exemplary embodiments can also be combined with one another.

| List of designations | |
|---|---|
| 1 | Substrate |
| 3 | Surface of 1 |
| 4 | Opposite side of 1 from 3 |
| 5 | Resist layer |
| 7 | Print head |
| 9 | Nozzle of 7 |
| 11 | Tank of 7 |
| 13 | Resist |
| 15 | Masked segment of 3 |
| 17 | Clear, unmasked segment of 3 |
| 19 | Vacuum chamber |
| 21 | Coating source |
| 23 | Optical filter layer |
| 231, 232, 233 | Individual layers of 23 |
| 25, 26, 27, 28 | Optical filter layer segment |
| 251, 252, 253 | Individual layers of 25 |
| 30 | Template |
| 33 | Contour mask |
| 35 | Segment cutout of 33 |
| 37 | Magnet arrangement |
| 371 | Pole shoe arrangement |
| 372 | Fine pole arrangement |
| 373 | Magnetic tape |
| 40 | Photoresist |
| 42 | Projection |
| 43 | Recess |
| 44 | Magnet body |
| 45 | Pole shoe |
| 46 | Poles of 44 |
| 47 | Return plate |
| 48 | Individual magnet |
| 100 | Glass substrate for a color wheel |
| 101 | Filter disk for a color wheel |
| 102 | Opening in 101 |
| 103 | Uncoated circle segment of 100 |
| 104 | Film/foil |
| 105 | Motor vehicle |
| 110 | Headlamp |

The invention claimed is:

1. A process for producing at least one optical filter layer segment on a substrate, comprising:
   applying a masking comprising a resist layer on a surface of the substrate;
   depositing an optical filter layer on the surface and the resist layer by vacuum deposition, wherein the step of depositing the optical filter layer comprises heating the surface and cooling the optical filter layer on the resist layer forming cracks in the optical filter layer; and
   removing the resist layer with a portion of the optical filter layer thereon from the surface by swelling the resist layer, wherein the swelling is introduced by a penetration of an alkaline solution through the cracks of the optical filter layer, wherein at least a portion of depositing the optical filter layer takes place at a temperature of over 150° C.

2. The process as claimed in claim 1, wherein the temperature has a range of 155° C. to 185° C.

3. The process as claimed in claim 1, wherein the vacuum deposition comprises plasma-enhanced deposition.

4. The process as claimed in claim 1, wherein applying the resist layer comprises applying a photoresist, exposing the photoresist, and developing the photoresist.

5. The process as claimed in claim 1, wherein applying the resist layer comprises applying a stop resist.

6. The process as claimed in claim 1, wherein removing the resist layer with the portion of the optical filter layer thereon from the surface comprises pulling off the resist layer with the portion of the optical filter layer thereon from the substrate.

7. The process as claimed in claim 1, wherein applying the resist layer comprises printing the resist layer.

8. The process as claimed in claim 7, wherein printing the resist layer comprises printing the resist layer by a print head.

9. The process as claimed in claim 1, wherein applying the resist layer comprises computer-controlled printing the resist layer.

10. The process as claimed in claim 1, wherein applying the resist layer comprises arranging a template on the surface and applying the resist layer to the surface and the template.

11. The process as claimed in claim 1, wherein applying the resist layer comprises applying the resist layer by a method selected from the group consisting of brushing, rolling, screen printing, and airless spraying.

12. The process as claimed in claim 1, wherein the vacuum deposition comprises vacuum deposition of at least one layer of the optical filter layer by a method selected from the group consisting of physical vapor deposition, sputtering, evaporation coating, chemical vapor deposition, and plasma impulse induced vapor deposition.

13. The process as claimed in claim 1, wherein depositing the optical filter layer comprises depositing multiple layers.

14. The process as claimed in claim 13, wherein depositing the multiple layers comprises depositing at least two individual layers each having a different composition.

15. The process as claimed claim 1, wherein depositing the optical filter layer comprises depositing an interference filter layer.

16. The process as claimed in claim 1, wherein removing the resist layer forms the at least one optical filter layer segment, and wherein the at least one optical filter layer segment has a shape of a circle.

17. The process as claimed in claim 1, wherein removing the resist layer forms the at least one optical filter layer segment and, wherein the at least one optical filter layer segment is shaped in a form of a visible item of information.

18. The process as claimed in claim 1, wherein removing the resist layer forms the at least one optical filter layer segment, and further comprising applying at least a second masking on at least one different segment of the surface and depositing a second optical filter layer on the at least one different segment and the at least second masking to form a second optical filter layer segment.

19. The process as claimed in claim 18, wherein applying the at least second masking comprises applying a plurality of different maskings to a plurality of different segments, and wherein depositing the second optical filter layer comprises depositing one of a plurality of different optical filter layers to each of the plurality of different segments and each of the plurality of different maskings.

20. The process as claimed in claim 1, wherein the surface comprises a disk-like substrate for a color wheel.

21. The process as claimed in claim 1, wherein the surface comprises a glass substrate or a glass surface of a substrate.

22. The process as claimed in claim 1, wherein the process is usable for producing a segmented optical filter.

23. The use of the process as claimed in claim 1, wherein the process is usable for the production of a sensor with a plurality of sensor surfaces and wherein the plurality of sensor surfaces has at least one sensor surface covered by an optical filter layer segment.

24. The process as claimed in claim 1, wherein the process is usable for coating films or foils.

25. The use of the process as claimed in claim 1, wherein the process is usable for coating substrates with decorative patterns.

26. The process as claimed in claim 1, wherein the vacuum deposition comprises sputtering or plasma-enhanced evaporation coating.

27. The process as claimed in claim 1, wherein depositing the optical filter layer comprises depositing the optical filter layer having a segment that is shaped in a form of a symbol or a logo.

28. A process for producing at least one optical filter layer segment on a substrate, comprising:
- applying a masking comprising a resist layer on at least a portion of a surface of the substrate;
- depositing an optical filter layer on the resist layer and remaining portions of the surface by heated vacuum deposition;
- forming cracks in the optical filter layer as the optical filter layer cools after the heated vacuum deposition;
- causing the resist layer to swell by allowing an alkaline solution to penetrate the optical filter layer through the cracks; and
- removing the resist layer with a portion of the optical filter layer thereon from the surface.

\* \* \* \* \*